US006849173B1

United States Patent
Chang et al.

(10) Patent No.: US 6,849,173 B1
(45) Date of Patent: Feb. 1, 2005

(54) TECHNIQUE TO ENHANCE THE YIELD OF COPPER INTERCONNECTIONS

(75) Inventors: Chung-Liang Chang, Hsinchu (TW); Shaulin Shue, Hsinchu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 10/170,249

(22) Filed: Jun. 12, 2002

(51) Int. Cl.[7] .......................... C25D 5/02; C25D 11/32; C25D 5/48
(52) U.S. Cl. ................. 205/118; 205/123; 205/157; 205/221
(58) Field of Search ................ 205/118, 123, 205/157, 221

(56) References Cited

U.S. PATENT DOCUMENTS

| 6,184,137 B1 | 2/2001 | Ding et al. ............. 438/687 |
| 6,245,676 B1 | 6/2001 | Ueno ..................... 438/687 |
| 6,258,710 B1 | 7/2001 | Rathore et al. ......... 438/628 |
| 6,287,954 B1 | 9/2001 | Ashley et al. ........... 438/622 |
| 6,531,046 B2 * | 3/2003 | Morrissey et al. ...... 205/219 |
| 2002/0074242 A1 * | 6/2002 | Morrissey et al. ...... 205/704 |
| 2002/0100693 A1 * | 8/2002 | Lu et al. ................. 205/157 |

FOREIGN PATENT DOCUMENTS

EP 1005078 A1 * 5/2000 ......... H01L/21/768

* cited by examiner

Primary Examiner—Edna Wong
(74) Attorney, Agent, or Firm—Haynes and Boone, LLP

(57) ABSTRACT

A method of forming an oxide free copper interconnect, comprising the following steps. A substrate is provided and a patterned dielectric layer is formed over the substrate. The patterned dielectric layer having an opening exposing a portion of the substrate. The opening having exposed sidewalls. A copper seed layer is formed over the sidewalls of the opening. The copper seed layer is subjected to an electrochemical technique to eliminate any copper oxide formed over the copper seed layer. A bulk copper layer is electrochemically plated over the copper-oxide-free copper seed layer, filling the opening and forming the oxide-free copper interconnect.

62 Claims, 2 Drawing Sheets

TECHNIQUE TO ENHANCE THE YIELD OF COPPER INTERCONNECTIONS

FIELD OF THE INVENTION

The present invention relates generally to semiconductor fabrication and more specifically to copper interconnection fabrication.

BACKGROUND OF THE INVENTION

There are currently no effect ways to recover or rework copper seed layer degraded due to exposure to air after processing in physical vapor deposition (PVD) chambers. The Q-time management of the copper seed layer deposition to the bulk copper plating over the copper seed layer impacts the production rate and product yield significantly.

U.S. Pat. No. 6,287,954 B1 to Ashley et al. describes a copper seed layer and plating process where the seed layer is converted into an intermetallic layer.

U.S. Pat. No. 6,258,710 B1 to Rathore et al. describes a method of providing sub-half-micron copper interconnections with improved electromigration and corrosion resistance.

U.S. Pat. No. 6,184,137 B1 to Ding et al. describes a structure and method for improving low temperature copper reflow in semiconductor features.

U.S. Pat. No. 6,245,676 B1 to Ueno describes a method of electroplating copper interconnects.

SUMMARY OF THE INVENTION

Accordingly, it is an object of one or more embodiments of the present invention to provide an improved method of fabricating copper interconnections by removing any copper oxide formed on the copper seed layer.

It is another object of one or more embodiments of the present invention to increase the operation window of plating and the product yield.

Other objects will appear hereinafter.

It has now been discovered that the above and other objects of the present invention may be accomplished in the following manner. Specifically, a substrate is provided and a patterned dielectric layer is formed over the substrate. The patterned dielectric layer having an opening exposing a portion of the substrate. The opening having exposed sidewalls. A copper seed layer is formed over the sidewalls of the opening. The copper seed layer is subjected to an electrochemical technique to eliminate any copper oxide formed over the copper seed layer. A bulk copper layer is electrochemically plated over the copper-oxide-free copper seed layer, filling the opening and forming the oxide-free copper interconnect.

BRIEF DESCRIPTION OF THE DRAWINGS

The present invention will be more clearly understood from the following description taken in conjunction with the accompanying drawings in which like reference numerals designate similar or corresponding elements, regions and portions and in which.

DETAILED DESCRIPTION OF THE PREFERRED EMBODIMENT

Initial Structure

Figure 1:
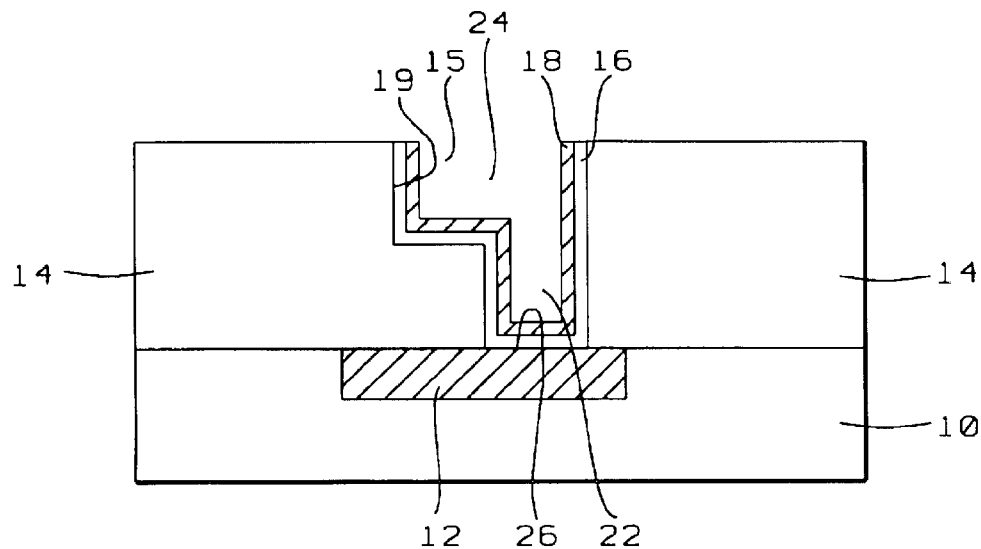
FIGS. 1 to 3 schematically illustrate a preferred embodiment of the present invention.

As shown in FIG. 1, structure 10 includes an exposed conductive structure 12 that is preferably comprised of a metal such as copper, aluminum, gold, silver or a copper alloy and is more preferably copper. Conductive structure 12 may be lines or plugs, for example, and may represent an Ml metal layer, for example.

Structure 10 is preferably a silicon substrate and is understood to possibly include a semiconductor wafer or substrate, active and passive devices formed within the wafer, conductive layers and dielectric layers (e.g., interpoly oxide (IPO), intermetal dielectric (IMD), etc.) formed over the wafer surface. The term "semiconductor structure" is meant to include devices formed within a semiconductor wafer and the layers overlying the wafer.

A patterned dielectric layer 14 having opening 15 is formed over semiconductor substrate 10 and conductive structure 12 to a thickness of preferably from about 3000 to 15,000 Å. Dielectric layer 14 is preferably comprised of a low-k dielectric material such as F-doped $SiO_2$, a low-k CVD low-k inorganic material or a low-k organic material and is more preferably comprised of F-doped $SiO_2$. Dielectric layer 14 exposes a portion 26 of conductive structure 12.

Opening 15 has exposed vertical and horizontal sidewalls, 19 and may include, for example, a lower via opening 22 and an M2 metal opening 24.

As shown in FIG. 1, an optional barrier layer 16 may be formed within the opening 15 over sidewalls 19 and over the exposed portion 26 of the conductive structure 12. Barrier layer 16 is preferably from about 5 to 20 Å thick and more prefereably from about 10 to 15 Å.

A copper (Cu) seed layer 18 is then formed over barrier layer 16 to a thickness of preferably from about 20 to 90 Å and more preferably from about 50 to 70 Å. Cu seed layer 18 is preferably formed by physical vapor deposition (PVD), chemical vapor deposition (CVD) or electroless deposition and more preferably PVD.

Formation of Copper Oxide Layer 20 Over Copper Seed Layer 18

Figure 2:
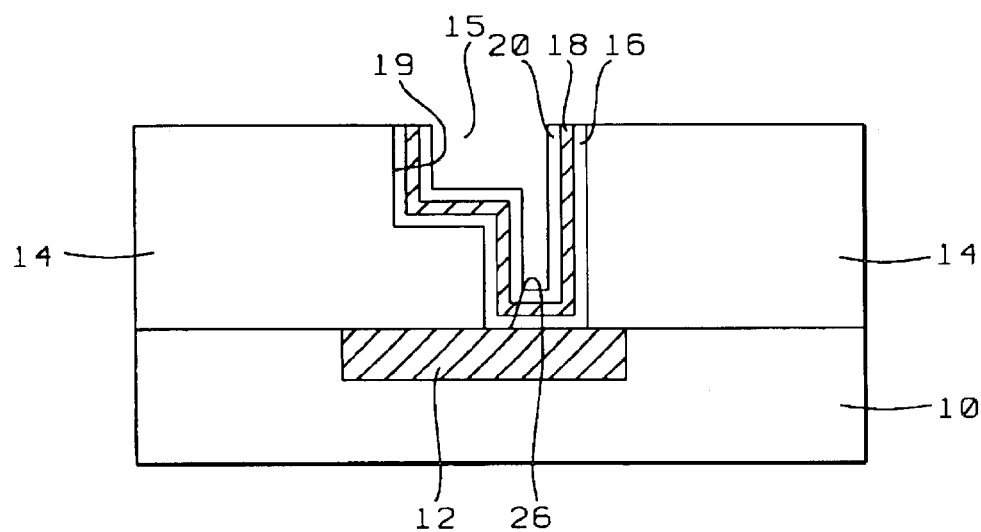

As shown in FIG. 2, after a Q (queue)-time of from about 1 to 8 hours, or more, after the PVD copper seed process, a copper oxide layer 20 may be formed over copper seed layer 18 due to the exposure of the wafer 10/copper seed layer 18 to air/oxygen. Such an oxide layer 20 causes EM failure and an increase in the via resistivity in the devices formed utilizing the copper interconnect 30 formed Electrochemical Technique to Remove Copper Oxide Layer 20

Figure 3:
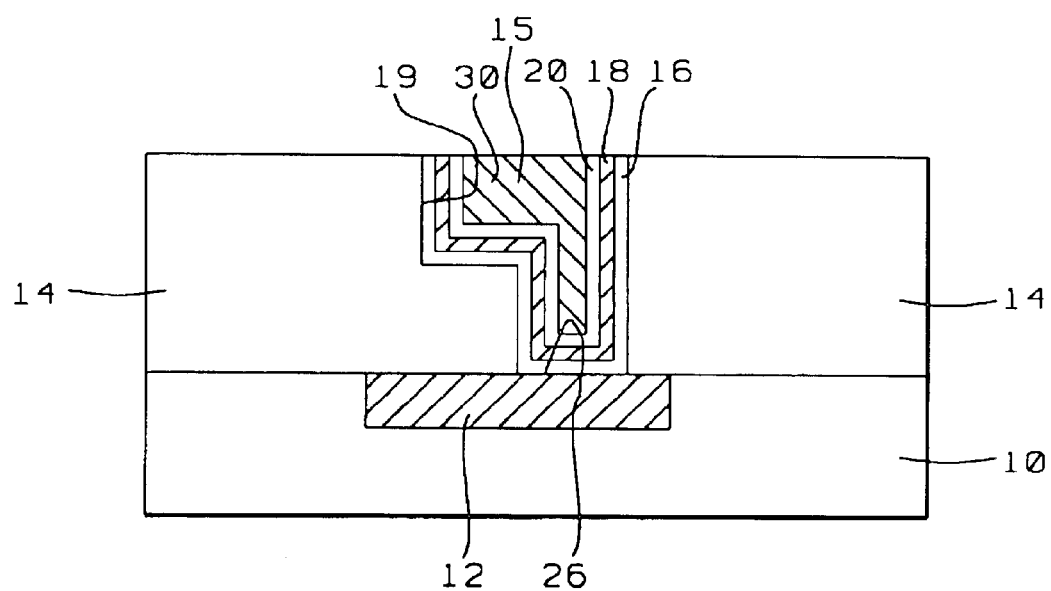

As shown in FIG. 3, an electrochemical technique is used to remove copper oxide layer 20 that is incorporated in the plating recipe to form the bulk electroplated copper layer 30 over copper seed layer 18. The electrochemical technique is performed as an in-situ pre-ECP (pre-electrochemical plating) clean process.

The electrochemical technique of the present invention causes the following electrochemical reduction to occur to reduce the copper oxide layer 20 to copper:

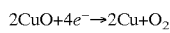

by one of two methods: (1) a potentiostat method that uses a constant voltage of from about 0.0 to −0.3 volts (V) vs. an Ag/AgCl reference electrode; or (2) a galvanostat method that uses a constant current of from about 0.05 to 5.00 milliamps/$cm^2$ ($mA/cm^2$). The potentiostat method is the more preferred electrochemical technique. Precisely applying a constant voltage relative to a reference electrode can define only the electrochemical reaction of CuO reduction happens during this pretreatment process.

A $CuSO_4$ electrolyte solution with or without additives such as an accelerator(s), a suppressor(s) and a leveler(s) is used with the electrochemical technique.

In a conventional ECP recipe, the first step is an initiation step with a current, I, if about 3.14 A (about 10 $mA/cm^2$).

However, when using the galvanostat electrochemical technique method of the present invention, for example, a lower constant current of from about 0.05 to 5.00 mA/cm² is used first as a pre-ECP cleaning step to reduce any copper oxide 20 to copper as shown above. (Similarly, when using the potentiostat electrochemical technique method of the present invention, for example, a lower constant voltage of from about 0.0 to 0.3 V than in a conventional ECP recipe is used first as a pre-ECP cleaning step to reduce any copper oxide 20 to copper as shown above.)

Then, the normal ECP recipe is continued with a higher voltage or higher current to plate Cu from the electrolyte solution onto the surface of the wafer, i.e. the cleaned Cu seed layer 18, filling the opening 15, i.e.:

$$Cu^{2+} + 2e^- \rightarrow Cu$$

The bulk plated copper layer may then be planarized to form a planarized copper interconnect 30 within TaN barrier layer 16/Cu seed layer 18 lined opening 15 as shown in FIG. 3.

Advantages of the Present Invention

The advantages of one or more embodiments of the present
1. copper oxide removal;
2. electrochemical reduction technique;
3. queue-time control from Cu seed deposition to Cu plating;
4. no extra equipment or tool modification requirement;
5. build-in process during Cu plating; and
6. product yield improvement.

While particular embodiments of the present invention have been illustrated and described, it is not intended to limit the invention, except as defined by the following claims.

We claim:

1. A method of forming an oxide-free copper interconnect, comprising the steps of:
providing a substrate;
forming a patterned dielectric layer over the substrate, the patterned dielectric layer having an opening exposing a portion of the substrate; the opening having exposed sidewalls;
forming a copper seed layer over the sidewalls of the opening;
subjecting the copper seed layer to an electrochemical technique in a container using a solution, to eliminate any copper oxide formed over the copper seed layer; and
electrochemically plating a bulk copper layer over the copper-oxide free copper seed layer, in the container using the solution, filling the opening and forming the oxide-free copper interconnect.

2. The method of claim 1, wherein the substrate is a semiconductor substrate.

3. The method of claim 1, wherein the substrate includes a conductive structure that is exposed by the opening.

4. The method of claim 1, wherein the substrate includes a conductive structure that is exposed by the opening; the conductive structure being comprised of a material selected from the group consisting of copper, aluminum, gold, silver and a copper alloy.

5. The method of claim 1, wherein the substrate includes a conductive structure that is exposed by the opening; the conductive structure being comprised of copper.

6. The method of claim 1, wherein the patterned dielectric layer is a low-k dielectric layer comprised of a material selected from the group consisting of F-doped $SiO_2$, a low-k CVD low-k inorganic material and a low-k organic material.

7. The method of claim 1, wherein the patterned dielectric layer is a low-k dielectric layer comprised of F-doped $SiO_2$.

8. The method of claim 1, wherein a barrier layer is formed over the sidewalls of the opening and the copper seed layer is formed over the barrier layer.

9. The method of claim 1, wherein a barrier layer is formed over the sidewalls of the opening and the copper seed layer is formed over the barrier layer; the barrier layer being comprised of a material selected from the group consisting of TaN, WN, Ta, TiN and TiSiN.

10. The method of claim 1, wherein a barrier layer is formed over the sidewalls of the opening and the copper seed layer is formed over the barrier layer; the barrier layer being comprised of TaN.

11. The method of claim 1, wherein a barrier layer is formed over the sidewalls of the opening and the copper seed layer is formed over the barrier layer; the barrier layer having a thickness of from about 10 to 15 Å.

12. The method of claim 1, wherein the copper seed layer has a thickness of from about 20 to 90 Å.

13. The method of claim 1, wherein the copper seed layer has a thickness of from about 50 to 70 Å.

14. The method of claim 1, wherein the copper seed layer is formed by a process selected from the group consisting of physical vapor deposition, chemical vapor deposition and electroless deposition.

15. The method of claim 1, wherein the copper seed layer is formed by a physical vapor deposition process.

16. The method of claim 1, wherein the electrochemical technique is performed as an in-situ pre-electrochemical plating process.

17. The method of claim 1, wherein the electrochemical technique reduces the copper oxide to copper.

18. The method of claim 1, wherein the electrochemical technique is a potentiostat method using a constant voltage or a galvanostat method using a constant current.

19. The method of claim 1, wherein the electrochemical technique is a potentiostat method using a constant voltage of from about 0.0 to 0.3 volts or a galvanostat method using a constant current of from about 0.05 to 5.00 miliamps/cm².

20. The method of claim 1, wherein the electrochemical technique is a potentiostat method using a constant voltage.

21. The method of claim 1, wherein the electrochemical technique is a potentiostat method using a constant voltage of from about 0.0 to 0.3 volts.

22. The method of claim 1, wherein the solution is a $CuSO_4$ electrolyte solution.

23. The method of claim 1, wherein the solution is a $CuSO_4$ electrolyte solution with one or more additives selected from the group consisting of accelerators, suppressors and levelers.

24. The method of claim 1, wherein the electrochemical technique is a galvanostat method using a constant current of from about 0.05 to 5.00 milliamps/cm² and the bulk copper layer is formed using an electrochemical plating step with an initial current of about 10 milliamps/cm².

25. The method of claim 1, wherein the electrochemical technique is a potentiostat method using a constant voltage that is lower than the initial voltage of the electrochemical plating of the bulk copper layer; or a galvanostat method using a constant current lower than the initial current of the electrochemical plating of the bulk copper layer.

26. The method of claim 1, wherein the subjecting the copper seed layer to an electrochemical technique further comprises employing a reference electrode.

27. A method of forming an oxide-free copper interconnect, comprising the steps of:
  providing a substrate;
  forming a patterned dielectric layer over the substrate; the patterned dielectric layer having an opening exposing a portion of the substrate; the opening having exposed sidewalls;
  forming a copper seed layer over the sidewalls of the opening;
  subjecting the copper seed layer to an electrochemical technique in a container using a solution, to eliminate any copper oxide formed over the copper seed layer; and
  electrochemically plating a bulk copper layer over the copper-oxide-free copper seed layer, in the container using the solution, filling the opening and forming the oxide-free copper interconnect; wherein the electrochemical technique is a potentiostat method using a constant voltage that is lower than the initial voltage of the electrochemical plating of the bulk copper layer; or a galvanostat method using a constant current lower than the initial current of the electrochemical plating of the bulk copper layer.

28. The method of claim 27, wherein the substrate is a semiconductor substrate.

29. The method of claim 27, wherein the substrate includes a conductive structure that is exposed by the opening.

30. The method of claim 27, wherein the substrate includes a conductive structure that is exposed by the opening; the conductive structure being comprised of a material selected from the group consisting of copper, aluminum, gold, silver and a copper alloy.

31. The method of claim 27, wherein the substrate includes a conductive structure that is exposed by the opening; the conductive structure being comprised of copper.

32. The method of claim 27, wherein the patterned dielectric layer is a low-k dielectric layer comprised of a material selected from the group consisting of F-doped $SiO_2$, a low-k CVD low-k inorganic material and a low-k organic material.

33. The method of claim 27, wherein the patterned dielectric layer is a low-k dielectric layer comprised of F-doped $SiO_2$.

34. The method of claim 27, wherein a barrier layer is formed over the sidewalls of the opening and the copper seed layer is formed over the barrier layer.

35. The method of claim 27, wherein a barrier layer is formed over the sidewalls of the opening and the copper seed layer is formed over the barrier layer; the barrier layer being comprised of a material selected from the group consisting of TaN, WN, Ta, TiN and TiSiN.

36. The method of claim 27, wherein a barrier layer is formed over the sidewalls of the opening and the copper seed layer is formed over the barrier layer; the barrier layer being comprised of TaN.

37. The method of claim 27; wherein a barrier layer is formed over the sidewalls of the opening and the copper seed layer is formed over the barrier layer; the barrier layer having a thickness of from about 10 to 15 Å.

38. The method of claim 27 wherein the copper seed layer has a thickness of from about 20 to 90 Å.

39. The method of claim 27, wherein the copper seed layer has a thickness of from about 50 to 70 Å.

40. The method of claim 27, wherein the copper seed layer is formed by a process selected from the group consisting of physical vapor deposition, chemical vapor deposition and electroless deposition.

41. The method of claim 27 wherein the copper seed layer is formed by a physical vapor deposition process.

42. The method of claim 27, wherein the electrochemical technique is performed as an in-situ pre-electrochemical plating process.

43. The method of claim 27, wherein the electrochemical technique reduces the copper oxide to copper.

44. The method of claim 27 wherein the electrochemical technique is a potentiostat method using a constant voltage of from about 0.0 to 0.3 volts or a galvanostat method using a constant current of from about 0.05 to 5.00 milliamps/cm$^2$.

45. The method of claim 27, wherein the electrochemical technique is a potentiostat method using a constant voltage.

46. The method of claim 27, wherein the electrochemical technique is a potentiostat method using a constant voltage of from about 0.0 to 0.3 volts.

47. The method of claim 27, wherein the solution is a $CuSO_4$ electrolyte solution.

48. The method of claim 27, wherein the solution is a $CuSO_4$ electrolyte solution with one or more additives selected from the group consisting of accelerators, suppressors and levelers.

49. The method of claim 27, wherein the electrochemical technique is a galvanostat method using a constant current of from about 0.05 to 5.00 milliamps/cm$^2$ and the bulk copper layer is formed using the electrochemical plating step with an initial current of about 10 milliamps/cm$^2$.

50. The method of claim 27, wherein the subjecting the copper seed layer to an electrochemical technique further comprises employing a reference electrode.

51. A method of forming an oxide free copper interconnect, comprising the steps of:
  providing a substrate;
  forming a patterned dielectric layer over the substrate; the patterned dielectric layer having an opening exposing a portion of the substrate; the opening having exposed walls;
  forming a barrier layer over the sidewalls of the opening;
  forming a copper seed layer over the barrier layer;
  subjecting the copper seed layer to an electrochemical technique in a container using a solution, to eliminate any copper oxide formed over the copper seed layer; and
  electrochemically plating a bulk copper layer over the copper oxide-free copper seed layer, in the container using the solution, filling the opening and forming the oxide-free copper interconnect; wherein the electrochemical technique is a potentiostat method using a constant voltage that is lower than the initial voltage of the electrochemical plating of the bulk copper layer; or a galvanostat method using a constant current lower than the initial current of the electrochemical plating of the bulk copper layer.

52. The method of claim 51, wherein the barrier layer is comprised of a material selected from the group consisting of a TaN, WN, Ta, TiN and TiSiN.

53. The method claim 51, wherein a barrier layer is comprised of a TaN.

54. The method of claim 51, wherein the electrochemical technique is performed as an in-situ pre-electrochemical plating process.

55. The method claim 51, wherein the electrochemical technique reduces the copper oxide to copper.

56. The method of claim 51, wherein the electrochemical technique is a potentiostat method using a constant voltage of from about 0.0 to 0.3 volts or a galvanostat method using a constant current of from about 0.05 to 5.00 milliamps/cm$^2$.

57. The method of claim 51, wherein the electrochemical technique is a potentiostat method using a constant voltage.

58. The method of claim 51, wherein the electrochemical technique is a potentiostat method using a constant voltage of from about 0.0 to 0.3 volts.

59. The method of claim 51, wherein the solution is a $CuSO_4$ electrolyte solution.

60. The method of claim 51, wherein the solution is a $CuSO_4$ electrolyte solution with one or more additives selected from the group consisting of accelerators, suppressors and levelers.

61. The method of claim 51, wherein the electrochemical technique is a galvanostat method using a constant current of from about 0.05 to 5.00 milliamps/cm$^2$ and the bulk copper layer is formed using the electrochemical plating step with an initial current of about 10 milliamps/cm$^2$.

62. The method of claim 51, wherein the subjecting the copper seed layer to an electrochemical technique further comprises employing a reference electrode.

* * * * *